United States Patent
Al-Sa'di et al.

(10) Patent No.: US 10,490,407 B2
(45) Date of Patent: Nov. 26, 2019

(54) METHOD OF MAKING A SEMICONDUCTOR SWITCH DEVICE

(71) Applicant: NXP B.V., Eindhoven (NL)

(72) Inventors: Mahmoud Shehab Mohammad Al-Sa'di, Al-Sa'di (DE); Petrus Hubertus Cornelis Magnee, Malden (NL); Johannes Josephus Theodorus Marinus Donkers, Valkenswaard (NL)

(73) Assignee: NXP B.V., Eindhoven (NL)

( * ) Notice: Subject to any disclaimer, the term of this patent is extended or adjusted under 35 U.S.C. 154(b) by 6 days.

(21) Appl. No.: 15/886,265

(22) Filed: Feb. 1, 2018

(65) Prior Publication Data

US 2018/0218906 A1 Aug. 2, 2018

(30) Foreign Application Priority Data

Feb. 2, 2017 (EP) .................................... 17154466

(51) Int. Cl.
| | | |
|---|---|---|
| *H01L 29/66* | (2006.01) | |
| *H01L 21/265* | (2006.01) | |
| *H01L 29/423* | (2006.01) | |
| *H01L 21/336* | (2006.01) | |
| *H01L 21/22* | (2006.01) | |
| *H01L 21/027* | (2006.01) | |
| *H01L 21/28* | (2006.01) | |

(52) U.S. Cl.
CPC ............ *H01L 21/22* (2013.01); *H01L 21/027* (2013.01); *H01L 21/28158* (2013.01)

(58) Field of Classification Search
CPC ......... H01L 21/823892; H01L 27/0921; H01L 27/11803
See application file for complete search history.

(56) References Cited

U.S. PATENT DOCUMENTS

| | | | |
|---|---|---|---|
| 4,108,686 A | 8/1978 | Jacobus, Jr. | |
| 4,306,916 A | 12/1981 | Wollesen et al. | |
| 5,648,281 A * | 7/1997 | Williams | ............ H01L 21/8249 |
| | | | 257/E21.375 |
| 6,297,082 B1 * | 10/2001 | Lin | ................. H01L 21/823807 |
| | | | 257/E21.443 |

(Continued)

OTHER PUBLICATIONS

U.S. Appl. No. 15/678,021, filed Aug. 15, 2017, Al-Sa'di et al.

*Primary Examiner* — Brian Turner (57) ABSTRACT

A method of making a semiconductor switch device. The method includes providing a semiconductor substrate having a major surface and a first semiconductor region having a first conductivity type located adjacent the major surface. The method also includes depositing a gate dielectric on the major surface. The method further includes implanting ions into the first semiconductor region through a mask positioned over the first semiconductor region, thereby to form a well region located in the first semiconductor region. The well region has a second conductivity type different to the first conductivity type. The method also includes depositing and patterning a gate electrode material on the gate dielectric to form a gate electrode located directly above the well region. The method further includes implanting ions into the first semiconductor region to form a source region and a drain region of the semiconductor switch device on either side of the gate electrode.

15 Claims, 5 Drawing Sheets

(56) References Cited

U.S. PATENT DOCUMENTS

| | | |
|---|---|---|
| 6,342,413 B1 | 1/2002 | Masuoka et al. |
| 8,003,455 B2 | 8/2011 | Cheng et al. |
| 2002/0094643 A1* | 7/2002 | Solomon ............... H01L 21/263 |
| | | 438/279 |
| 2002/0096697 A1 | 7/2002 | Tihanyi |
| 2002/0109206 A1* | 8/2002 | Schimpf ............. H01L 21/8249 |
| | | 257/578 |
| 2005/0046444 A1* | 3/2005 | Keil ....................... H03K 3/021 |
| | | 326/84 |
| 2006/0022526 A1* | 2/2006 | Cartalade ............. H03K 17/693 |
| | | 307/112 |
| 2006/0270103 A1* | 11/2006 | Das .................... H01L 29/0873 |
| | | 438/105 |
| 2008/0001258 A1* | 1/2008 | Ema ............... H01L 21/823892 |
| | | 257/607 |
| 2008/0128756 A1* | 6/2008 | Satoh ............. H01L 21/823892 |
| | | 257/203 |
| 2009/0179266 A1* | 7/2009 | Abadeer ................. H01L 21/84 |
| | | 257/347 |
| 2009/0194789 A1* | 8/2009 | Griebenow ....... H01L 21/26506 |
| | | 257/190 |
| 2010/0164017 A1 | 7/2010 | Noda |
| 2010/0258867 A1* | 10/2010 | Lee .................... H01L 29/0634 |
| | | 257/339 |
| 2010/0320501 A1* | 12/2010 | Gendron ............. H01L 27/0259 |
| | | 257/173 |
| 2012/0211841 A1* | 8/2012 | Kurjanowicz ......... G11C 17/16 |
| | | 257/369 |
| 2012/0267724 A1* | 10/2012 | Venkatesan ......... H01L 29/1083 |
| | | 257/402 |
| 2012/0293206 A1* | 11/2012 | Yoneda ............ H03K 19/17736 |
| | | 326/101 |
| 2014/0011332 A1* | 1/2014 | Meng ................ H01L 29/66545 |
| | | 438/197 |
| 2014/0357027 A1* | 12/2014 | Luo .................. H01L 21/28518 |
| | | 438/154 |
| 2016/0027644 A1* | 1/2016 | Tsai .................. H01L 21/02576 |
| | | 257/408 |
| 2017/0221994 A1 | 8/2017 | Al-Sa'di et al. |

\* cited by examiner

METHOD OF MAKING A SEMICONDUCTOR SWITCH DEVICE

CROSS-REFERENCE TO RELATED APPLICATIONS

This application claims the priority under 35 U.S.C. § 119 of European patent application no. 17154466.1, filed Feb. 2, 2017 the contents of which are incorporated by reference herein.

BACKGROUND

The present specification relates to method of making a semiconductor switch device and to a semiconductor switch device.

Metal Oxide Semiconductor Field Effect Transistors (MOSFETs) can be used as electric switches for high Radio Frequency (RF) signals. For these applications the device does not actually switch at high frequencies, rather it passes or blocks RF signals. Best performance is achieved with a device that combines low series resistance in on-state with low input capacitance in off-state. One of the most popular ways to evaluate the overall performance of an RF Switch MOSFET is to calculate a figure of merit (FOM), which is defined as the product of the on-state resistance ($R_{on}$) and the off-state capacitance ($C_{off}$).

Contributions to the off-state capacitance are the gate-to-source ($C_{gs}$), gate-to-drain ($C_{gd}$), gate-to-substrate ($C_{gb}$), drain-to-substrate ($C_{db}$), and source-to-substrate ($C_{sb}$) capacitance as shown in the following formulas:

$$C_{off} = \left(\frac{1}{C_{dd} - C_{ds}} + \frac{1}{C_{ss} - C_{ds}}\right)^{-1} + C_{ds}$$

$$C_{ss} = C_{sd} + C_{sg} + C_{sb}$$

$$C_{dd} = C_{ds} + C_{dg} + C_{db}$$

$$C_{gg} = C_{gs} + C_{gd} + C_{gb}.$$

Here, $C_{ds}$ is the channel capacitance, and $C_{sb}$, $C_{db}$, and $C_{gb}$ are the source to bulk, drain to bulk and gate to bulk capacitances, respectively. The overlap capacitance ($C_{gs}=C_{gd}$) and parasitic junction capacitance ($C_{db}=C_{sb}$) are of great importance as they constitute both significant fractions of the total off-state capacitance ($C_{off}$). Therefore, to achieve low $C_{off}$, the overlap capacitance and parasitic junction capacitances need to be reduced.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a method of making a semiconductor switch device, the method comprising:
providing a semiconductor substrate having:
a major surface; and
a first semiconductor region having a first conductivity type located adjacent the major surface;
depositing a gate dielectric on the major surface of the substrate;
implanting ions into the first semiconductor region through an opening in a mask positioned over the first semiconductor region, thereby to form a well region located in the first semiconductor region, the well region having a second conductivity type different to the first conductivity type;
depositing and patterning a gate electrode material on the gate dielectric to form a gate electrode located directly above the well region; and
implanting ions into the first semiconductor region to form a source region and a drain region of the semiconductor switch device on either side of the gate electrode.

The use of the mask can prevent ions that are implanted to form the well region of the device from entering the parts of the first semiconductor region that will accommodate the source and drain regions on either side of the gate. This may allow the parasitic junction capacitances ($C_{db}=C_{sb}$) and, therefore, the off-state capacitance ($C_{off}$) of the device to be relatively low, owing to the reduced amount of impurity doping that occurs in the vicinity of the source and drain regions. Note that the gate electrode of the device is located directly above the well region, whereby a channel region of the device is located in the well region.

The method may further include implanting ions into the first semiconductor region through the opening in the mask positioned over the first semiconductor region, thereby to adjust a threshold voltage of the semiconductor switch device. The mask can thus prevent at least some of these ions from entering the parts of the first semiconductor region that will accommodate the source and drain regions on either side of the gate. This may again allow the parasitic junction capacitance of the device to remain relatively low, even when ions are implanted for adjusting the threshold voltage (sometimes referred to as a DVt implant).

The method may further include implanting ions into the first semiconductor region through the opening in the mask positioned over the first semiconductor region, thereby to inhibit punch-through in the semiconductor switch device. The mask can thus prevent at least some of these ions from entering the parts of the first semiconductor region that will accommodate the source and drain regions on either side of the gate. This may again allow the parasitic junction capacitance of the device to remain relatively low, even when ions are implanted to inhibit punch-through in the semiconductor switch device (sometimes referred to as an Anti-Punch-Through (APT) implant).

A lateral dimension of the opening in the mask may be substantially equal to $L_g+2*MTL$, where $L_g$ is a gate length of the semiconductor switch device, where MTL is a mask tolerance of the opening, and where MTL≤600 nm. In some embodiments, the mask tolerance MTL may be in the range 0-200 nm. The gate length $L_g$ may be in the sub-micron range.

The ions implanted for forming the well region may comprise Boron ions.

An implantation energy of the implant for forming the well region may be in the range 50 keV-4 MeV.

A peak concentration of the implanted ions of the implant for forming the well region may be at a depth of around 0.1-2 μm beneath the major surface of the semiconductor substrate.

An implantation dose of the implant for forming the well region may be in the range $10^{11}$-$10^{14}$ cm$^{-2}$.

The first conductivity type may be n-type and the second conductivity type may be p-type. However, it is envisaged that the first conductivity type may be p-type and the second conductivity type may be n-type.

The method may include forming spacers on opposed sidewalls of the gate electrode prior to implanting the ions into the first semiconductor region to form the source region and the drain region. The spacers may be formed on the sidewalls of the gate electrode after the use of the aforementioned mask, whereby the formation of the spacers need not interfere with the use of the mask or any of the various implants that may be carried out through the mask.

The first semiconductor region may be a doped epitaxial layer. The doped epitaxial layer may be provided as an upper layer on a Silicon-on-Insulator (SOI) substrate. In another example, the doped epitaxial layer may be provided on an underlying bulk semiconductor (e.g. silicon) substrate.

According to another aspect of the present disclosure, there may be provided a semiconductor switch device made using the method described above. The semiconductor switch device may be a Radio Frequency (RF) switch device.

A device of the kind described herein may be an RF switch device, for switching an RF signal. For the purposes of this disclosure "Radio Frequency" (RF) refers to frequencies typically in the range of, but not limited to 0.5 GHz≤f≤90 GHz. Note that although a semiconductor switch device according to embodiments of this disclosure may be used to pass or block an RF signal, typically the device would not actually switch at the RF frequency itself.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

FIGS. 1A-1D the various stages in a show a method for making a field effect transistor of a semiconductor switch device according to an embodiment of the present disclosure.

Figure 1A:
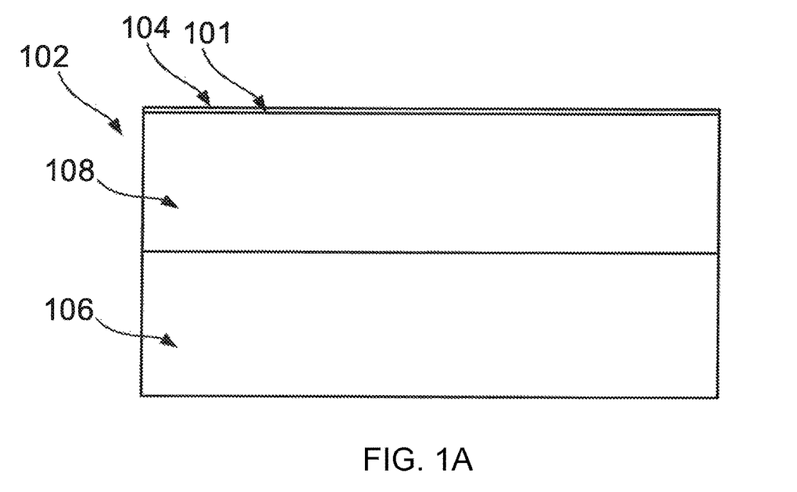
FIGS. 1A-1D show a method for making a field effect transistor of a semiconductor switch device according to an embodiment of the present disclosure.

In a first stage, shown in FIG. 1A, there is provided a semiconductor substrate 102. The substrate 102 may, for instance, comprise silicon. The substrate 102 has a major surface 101. The substrate 102 comprises a first semiconductor region 108 having a first conductivity type located adjacent the major surface 101. In this example, the first conductivity type is n-type, although is it envisaged that the first conductivity type may be p-type.

Where the first conductivity type is n-type, the first semiconductor region 108 may be doped with Arsenic, Phosphorus or Antimony. On the other hand, where the first conductivity type is p-type, the first semiconductor region 108 may be doped with Boron or Indium.

In this example, the first semiconductor region 108 comprises a doped epitaxial silicon layer located on an underlying part 106 (e.g. the bulk) of the substrate 102. The thickness of the epitaxial layer forming the first semiconductor region 108 may be around 0.1-1 µm. The underlying part 106 may be have a second conductivity type, that is a different conductivity type to the first conductivity type of the first semiconductor region 108. Where the second conductivity type is p-type, underlying part 106 may be doped with Boron. On the other hand, where the second conductivity type is n-type, the underlying part 106 may be doped with Arsenic. In the present example comprises p-type doped silicon.

As shown in FIG. 1, a dielectric layer 104 is deposited on the major surface 101 of the semiconductor substrate 102. The dielectric layer 104 will subsequently be patterned to form a gate dielectric of the semiconductor switch device. The dielectric layer 104 may, for instance, comprise silicon oxide.

Figure 1B:
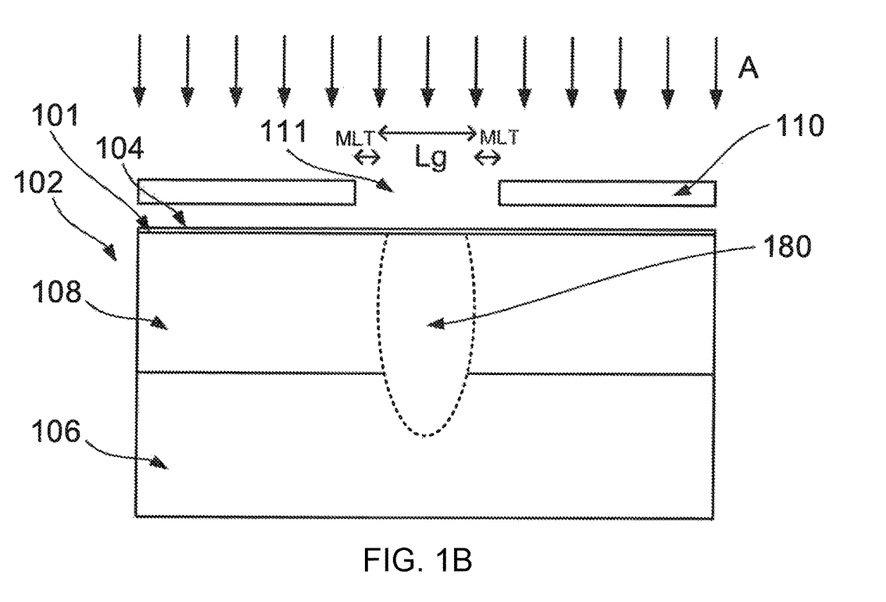

In a next stage shown in FIG. 1B, a number of ion implantation steps may be performed. Prior to implanting the ions, a mask 110 may be positioned over the major surface 101 of the semiconductor substrate 102. The mask 110 has an opening 111.

As shown in FIG. 1B, a lateral dimension of the opening 111 in the mask 110 is substantially equal to $L_g$+2*MTL, wherein $L_g$ is a gate length of the semiconductor switch device, and wherein MTL is a mask tolerance of the opening. It is envisaged that the mask tolerance MTL may be ≤600 nm. In a particular embodiment, the mask tolerance MTL may be in the range 0-200 nm. The gate length $L_g$ of a semiconductor switch device of the kind described herein may be less than 1 µm. To summarise, the lateral dimension of the opening 11 in the mask 110 is approximately equal to the gate length $L_g$, allowing also for the mask tolerance of the opening 111 through which the ions are to be implanted as described below.

Having positioned the mask 110 over the major surface 101 of the semiconductor substrate 102, ions are implanted into the first semiconductor region through the opening 111. The implantation ions a represented by the arrows labelled A in FIG. 1B. As shown in FIG. 1B, the implanted ions form a well region 180 located in the first semiconductor region 108. The well region 180 will contain a channel region of the field effect transistor forming the semiconductor switch device. The well region 180 has the second conductivity type, which as noted above is different to the first conductivity type. Accordingly, in the present example, the well region 180 is p-type, for forming an NMOS device. In examples in which the second conductivity type is n-type, the well region 180 may accordingly be n-type, for forming a PMOS device.

Where the first conductivity type is n-type, the ions implanted for forming the well region 180 may, for instance, comprise Boron ions. An implantation energy of the ions implanted for forming the well region 180 may be in the range 50 keV-4 MeV, or more typically in the range of 100-300 keV. A peak concentration of the implanted ions of the implant for forming the well region 180 may be at a depth of around 0.1-2 µm beneath the major surface 101 of the semiconductor substrate 102. An implantation dose of the implant for forming the well region 180 may be in the range $10^{11}$-$10^{14}$ cm$^{-2}$.

On the other hand, where the first conductivity type is p-type, the ions implanted for forming the well region 180 may, for instance comprise Phosphorus (or Arsenic) ions. An implantation energy of the ions implanted for forming the well region 180 may be in the range 100 keV-1 MeV. A peak concentration of the implanted ions of the implant for forming the well region 180 may be at a depth of around 0.1-2 μm μm beneath the major surface 101 of the semiconductor substrate 102. An implantation dose of the implant for forming the well region 180 may be in the range $10^{11}$-$10^{14}$ cm$^{-2}$.

The well region 180 formed by the implant may extend completely through the first semiconductor region 108. As shown in FIG. 1B, the well region 180 may extend partially into the underling part 106 of the substrate 102. The well region 180 and the underlying part 106 of the semiconductor substrate 102 typically have the same conductivity type (i.e. the second conductivity type), which in the present example is p-type.

In addition to implanting ions for forming the well region 180, one or more other implants may be performed.

For instance, in one example, ions may be implanted through the opening 111 in the mask 110 positioned over the first semiconductor region of the semiconductor substrate 102, thereby to adjust a threshold voltage of the semiconductor switch device (this may be referred to as a DVt implant).

For an NMOS device (i.e. the first conductivity type is n-type, the second conductivity type is p-type), the ions implanted for adjusting a threshold voltage of the semiconductor switch device may, for instance, comprise Boron or Indium. An implantation energy of the ions implanted for adjusting the threshold voltage may be in the range 5-100 keV. A peak concentration of the implanted ions of the implant for adjusting the threshold voltage may be at a depth of around 10-100 nm beneath the major surface 101 of the semiconductor substrate 102. An implantation dose of the implant for adjusting the threshold voltage may be in the range $10^{11}$-$10^{14}$ cm$^{-2}$.

On the other hand, for a PMOS device (i.e. the first conductivity type is p-type, the second conductivity type is n-type), the ions implanted for adjusting a threshold voltage of the semiconductor switch device may, for instance, comprise Arsenic, Phosphorus or Antimony. An implantation energy of the ions implanted for adjusting the threshold voltage may be in the range 5-200 keV. A peak concentration of the implanted ions of the implant for adjusting the threshold voltage may be at a depth of around 10-100 nm beneath the major surface 101 of the semiconductor substrate 102. An implantation dose of the implant for adjusting the threshold voltage may be in the range $10^{11}$-$10^{14}$ cm$^{-2}$.

In another example, ions may be implanted through the opening 111 in the mask 110 positioned over the first semiconductor region of the semiconductor substrate 102, thereby to inhibit punch-through in the semiconductor switch device (this may be referred to as an anti-punch-through, or "APT" implant).

For an NMOS device (i.e. the first conductivity type is n-type, the second conductivity type is p-type), the ions implanted for inhibiting punch-through in the semiconductor switch device may, for instance, comprise Boron. An implantation energy of the ions implanted for inhibiting punch-through may be in the range 10-200 keV. A peak concentration of the implanted ions of the implant for inhibiting punch-through may be at a depth of around 0.1-2 μm beneath the major surface 101 of the semiconductor substrate 102. An implantation dose of the implant for inhibiting punch-through may be in the range $10^{11}$-$10^{14}$ cm$^{-2}$.

On the other hand, for a PMOS device (i.e. the first conductivity type is p-type, the second conductivity type is n-type), the ions implanted for inhibiting punch-through in the semiconductor switch device may, for instance, comprise Phosphorus. An implantation energy of the ions implanted for inhibiting punch-through may be in the range 50-200 keV. A peak concentration of the implanted ions of the implant for inhibiting punch-through may be at a depth of around 0.1-2 μm beneath the major surface 101 of the semiconductor substrate 102. An implantation dose of the implant for inhibiting punch-through may be in the range $10^{11}$-$10^{14}$ cm$^{-2}$.

Figure 1C:
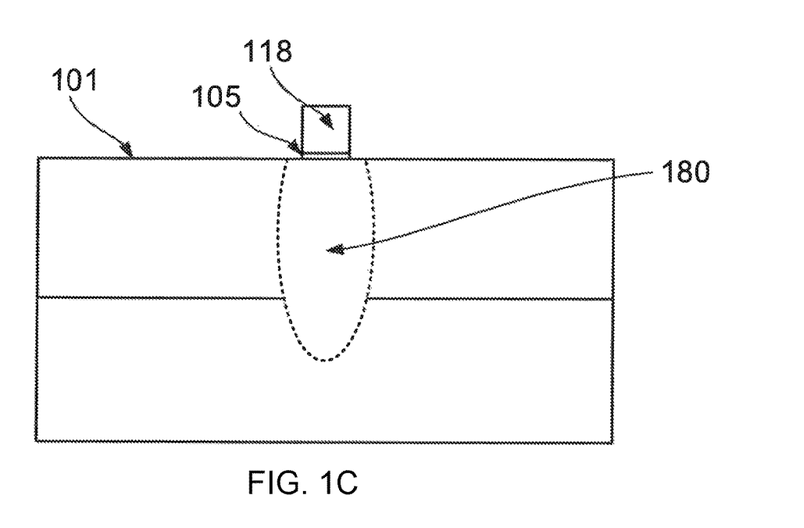

In a next stage shown in FIG. 1C, following removal of the mask 110, a gate of the field effect transistor may be formed. This may be achieved by depositing a gate electrode material (e.g. doped polysilicon) over the dielectric layer 104, and then patterning the gate electrode material and the dielectric layer 104 to reach the arrangement shown in FIG. 1C. The gate may include a gate electrode 118 located on a remaining part 105 of the aforementioned dielectric layer 104. As discussed above, the gate has a gate length $L_g$. The gate is located directly above the well region 180. Note that since the opening 111 in the mask 110 described above had a lateral dimension given by $L_g+2*MTL$, the gate may be approximately the same size (laterally) as the well region 180, at least at positions close to the major surface 101 of the semiconductor substrate 102.

Figure 1D:
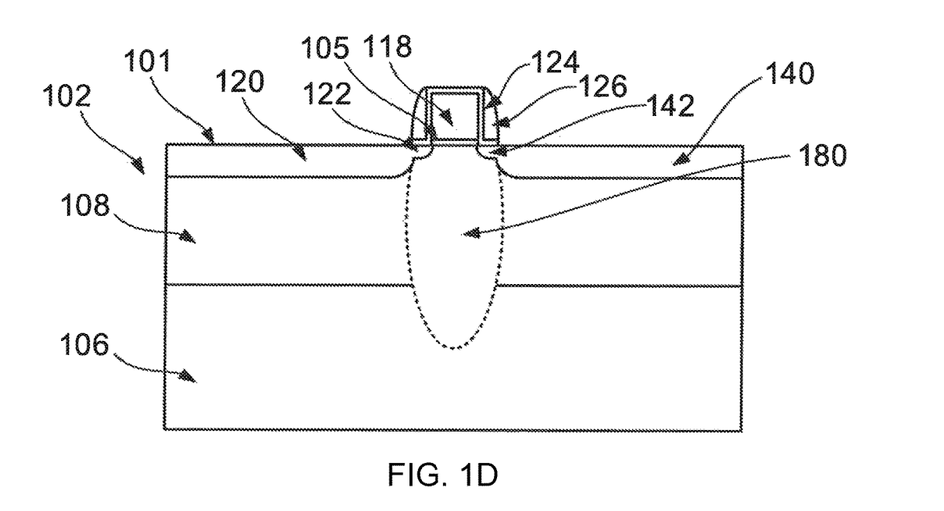

In a next stage shown in FIG. 1D, the gate may be provided with sidewall spacers 126. As is known in the art, a layer 124 comprising Silicon Oxide may be deposited over the gate electrode prior to the formation of the spacers 126. The layer 124 may cover at least the sidewalls of the gate electrode. The spacers 126 may partially mask the parts of the first semiconductor region 108 located immediately on either side of the gate, during formation of the source and drain regions to be described below.

Following the optional formation of the spacers 126, a source region 120 and drain region 140 of the device may be formed on either side of the gate electrode using ion implantation. As can be seen in FIG. 1D, the source and drain regions 120, 142 generally occupy parts of the first semiconductor region 108 close to the major surface 101 of the semiconductor substrate 102, and may extend inwards towards the peripheral edges of the well region 180. The source and drain region are both of the first conductivity type (n-type in the present example). For an NMOS device (i.e. the first conductivity type is n-type, the second conductivity type is p-type), the ions implanted for forming the source and drain regions may, for instance, comprise Arsenic, Phosphorus (or Antimony). On the other hand, for a PMOS device (i.e. the first conductivity type is p-type, the second conductivity type is n-type), the ions implanted for forming the source and drain regions may, for instance, comprise Boron (or Indium).

It is also envisaged that LDD regions 122, 142 of the first conductivity type may be formed beneath the spacers 126 using ion implantation. These LDD regions 122, 142 are generally lightly doped compared to the source and drain regions 120, 140 themselves, and the implants used to form them may be shallower than those used to form the source and drain regions 120, 140. The same kinds of ions may be used to form the LDD regions 122, 142 as those mentioned above for forming the source and drain regions 120, 140. As can be seen in FIG. 1D, the LDD regions 122, 142 may extend from the edges of the source and drain regions 120, 140, partially into well region 180.

With reference to FIGS. 1B and 1D, it will be appreciated that the use of the mask 110 during the implantation steps for forming the well region 180, for adjusting the threshold voltage and for inhibiting punch-through can prevent the ions associated with these implants entering the parts of the first semiconductor region 108 which will subsequently be occupied by the source region 120 and the drain region 140. This may allow the parasitic junction capacitances ($C_{db}$, $C_{ds}$) and, therefore, the off-state capacitance ($C_{off}$) of the device to be relatively low, owing to the reduced amount of impurity doping that occurs in the vicinity of the source region 120 and drain regions 140.

Figure 2:
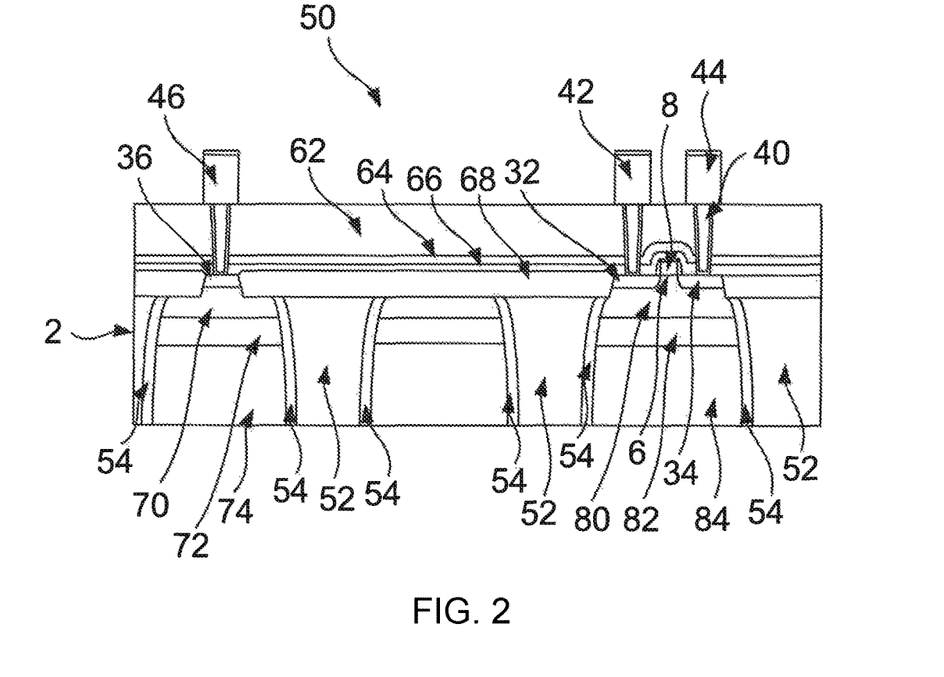
FIG. 2 shows a semiconductor switch device according to an embodiment of the present disclosure.

FIG. 2 shows a semiconductor switch device 50 according to an embodiment of the present disclosure. The device 50 in this example is an NMOS switch device for use in RF applications. The device 50 includes a MOS field effect transistor comprising a source region 32, drain region 34, gate electrode 8, gate dielectric 6. The device also includes a body contact 36. The source region 32, drain region 34 and body contact 36 may be provided with electrical contacts 42, 44, 46, respectively (as is the gate electrode 8, although this is not shown in FIG. 2). These electrical contacts 42, 44, 46 may be connected to the source region 32, drain region 34 and body contact 36 by electrically conductive members 40 extending through one or more inter metal dielectric layers 62, 64, 66 (for example silicon oxide and silicon nitride) located provided on a major surface of the substrate 2.

The source region 32 and drain region 34 in this example are located in a p-type well 80. The body contact 36 is located in another p-type well 70. Isolations regions 68 (such as shallow trench isolation (STI)) may be used to isolate the features located in the different wells. In this example, an optional buried p+ layer 82 may be located beneath the p-type well 80, and an optional buried p+ layer 72 may be located beneath the p-type well 70. Each well and buried p+ layer is connected through the underlying parts 74, 84 of the substrate 2, which may be p– doped. The wells 70, 80 and buried layers 72, 82 may also be separated by deep trench isolation 52 (DTI). The sidewalls of the DTI may be lined with one or more dielectric layers 54, such as silicon oxide.

The p-type well 80, source region 32, drain region 34 and gate of the device 50 shown in FIG. 2 may be formed using the method described herein (e.g. the method of FIG. 1).

Figure 3:
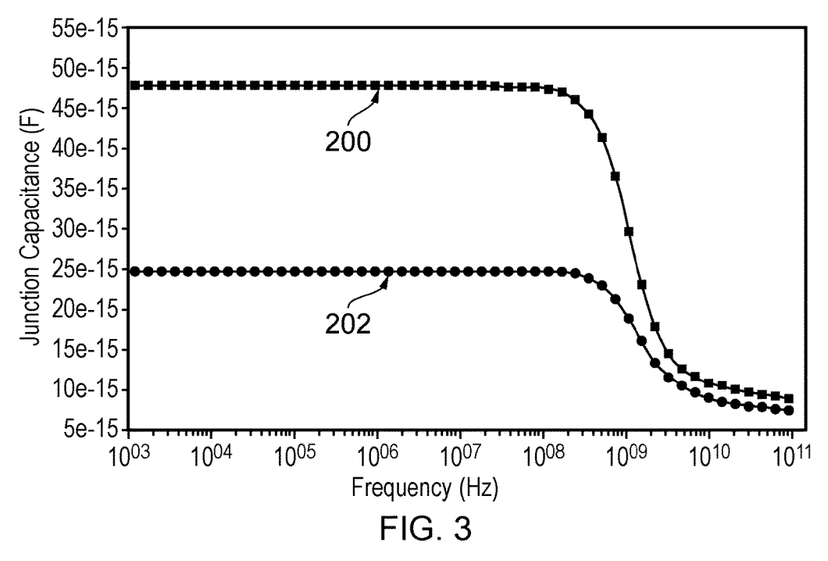
FIG. 3 compares the simulated parasitic junction capacitance of a conventional field effect transistor with that of a field effect transistor made using a method of the kind shown in FIGS. 1A-1D.

FIG. 3 compares the simulated parasitic junction capacitance ($C_{db}=C_{sb}$), as a function of frequency, of a conventional NMOS field effect transistor (plot labelled 200) with that of an NMOS field effect transistor made using a method of the kind described in relation to FIGS. 1A-1D (plot labelled 202). As can be seen from FIG. 3, an embodiment of this disclosure may produce an approximately 50% reduction in parasitic junction capacitance compared to a conventional NMOS field effect transistor.

Figure 4:
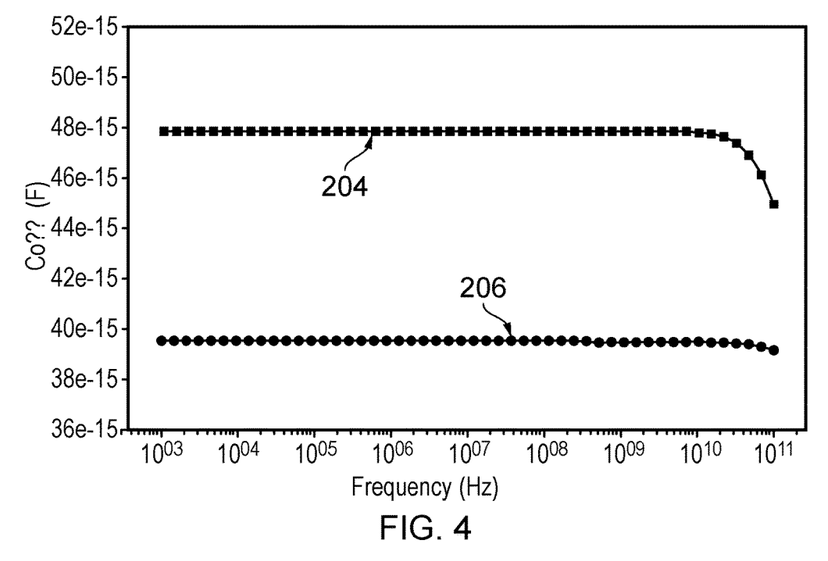
FIG. 4 compares the simulated off-state capacitance of a conventional field effect transistor with that of a field effect transistor made using a method of the kind shown in FIGS. 1A-1D.

FIG. 4 compares the simulated off-state capacitance ($C_{off}$) of a conventional NMOS field effect transistor (plot labelled 204) with that of an NMOS field effect transistor made using a method of the kind described in relation to FIGS. 1A-1D (plot labelled 206). As can be seen from FIG. 4, an embodiment of this disclosure may produce an approximately 17% reduction in $C_{off}$ compared to a conventional NMOS field effect transistor.

Figure 5:
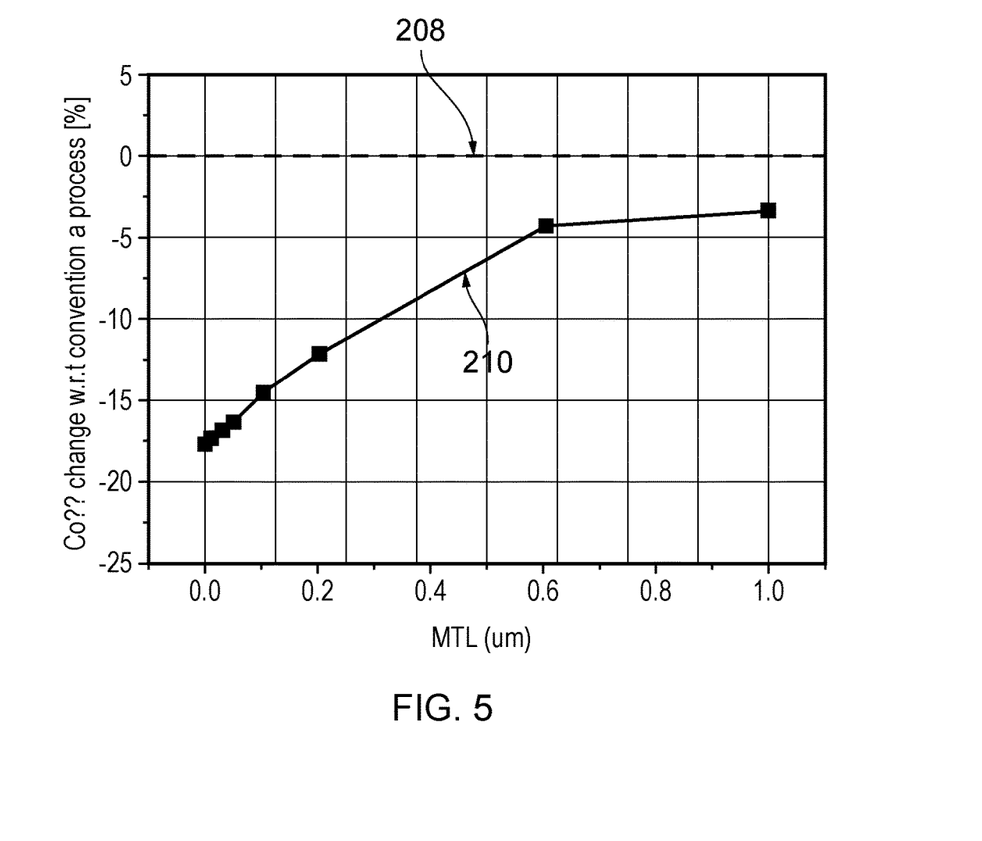
FIG. 5 shows the impact of mask tolerance MTL (i.e. total mask opening=$L_g$+2MTL) on the off-state capacitance for a semiconductor switch device according to an embodiment of the present disclosure.

FIG. 5 shows the impact of mask tolerance MTL (i.e. total mask opening=$L_g$+2MTL) on the off-state capacitance ($C_{off}$) for a semiconductor switch device (NMOS) according to an embodiment of the present disclosure. In FIG. 5, the baseline 208 corresponds to a conventional NMOS field effect transistor, while the plot 210 corresponds to an NMOS field effect transistor made using a method of the kind described in relation to FIGS. 1A-1D. The vertical axis in FIG. 5 indicates the percentage change in $C_{off}$ in the plot 210, as a function of MTL, compared to the conventional device. As can be seen in FIG. 5, a reduction in $C_{off}$ may be achieved across a range of values of MTL, and the largest gains are typically made at smaller mask tolerances.

Accordingly, there has been described a method of making a semiconductor switch device. The method includes providing a semiconductor substrate having a major surface and a first semiconductor region having a first conductivity type located adjacent the major surface. The method also includes depositing a gate dielectric on the major surface. The method further includes implanting ions into the first semiconductor region through a mask positioned over the first semiconductor region, thereby to form a well region located in the first semiconductor region. The well region has a second conductivity type different to the first conductivity type. The method also includes depositing and patterning a gate electrode material on the gate dielectric to form a gate electrode located directly above the well region. The method further includes implanting ions into the first semiconductor region to form a source region and a drain region of the semiconductor switch device on either side of the gate electrode.

Although particular embodiments of this disclosure have been described, it will be appreciated that many modifications/additions and/or substitutions may be made within the scope of the claims.

The invention claimed is:

1. A method of making a semiconductor switch device, the method comprising:
   providing a semiconductor substrate having:
      a major surface;
      a first semiconductor region having a first conductivity type located adjacent the major surface; and
      an underlying part having a second conductivity type different from the first conductivity type;
   wherein the first semiconductor region comprises a layer of material having the first conducting type located on the underlying part;
   depositing a gate dielectric on the major surface of the substrate;
   implanting ions into the first semiconductor region through an opening in a mask positioned over the first semiconductor region, thereby to form a well region located in the first semiconductor region, the well region having the second conductivity type, wherein the ions implanted through the opening in the mask positioned over the first semiconductor region to form the well region extend completely through the layer of material of the first semiconductor region and partially into the underlying part;
   depositing and patterning a gate electrode material on the gate dielectric to form a gate electrode located directly above the well region; and
   implanting ions into the first semiconductor region to form a source region and a drain region of the semiconductor switch device on either side of the gate electrode.

2. The method of claim 1, further comprising implanting ions into the first semiconductor region through the opening in the mask positioned over the first semiconductor region, thereby to adjust a threshold voltage of the semiconductor switch device.

3. The method of claim 1, further comprising implanting ions into the first semiconductor region through the opening in the mask positioned over the first semiconductor region, thereby to inhibit punch-through in the semiconductor switch device.

4. The method of claim 1, wherein a lateral dimension of the opening in the mask is substantially equal to $L_g+2*MTL$, wherein $L_g$ is a gate length of the semiconductor switch device, wherein MTL is a mask tolerance of the opening, and wherein MTL≤600 nm.

5. The method of claim 4, wherein the mask tolerance MTL is in the range 0-200 nm.

6. The method of claim 4, wherein the gate length $L_g$ is less than 1 μm.

7. The method of claim 1, wherein the ions implanted for forming the well region comprise Boron ions.

8. The method of claim 1, wherein an implantation energy of the implant for forming the well region is in the range 50 keV-4 MeV.

9. The method of claim 1, wherein a peak concentration of the implanted ions of the implant for forming the well region is at a depth of around 0.1-2 μm beneath the major surface of the semiconductor substrate.

10. The method of claim 1, wherein an implantation dose of the implant for forming the well region is in the range $10^{11}$-$10^{14}$ cm$^{-2}$.

11. The method of claim 1, wherein the first conductivity type is n-type and wherein the second conductivity type is p-type.

12. The method of claim 1, comprising forming spacers on opposed sidewalls of the gate electrode prior to implanting the ions into the first semiconductor region to form the source region and the drain region.

13. The method of claim 1, wherein the first semiconductor region comprises a doped epitaxial layer.

14. A semiconductor switch device made using the method of claim 1.

15. The device of claim 14, wherein the device is a Radio Frequency (RF) switch device.

* * * * *